(12) United States Patent
Singh

(10) Patent No.: US 9,520,396 B2
(45) Date of Patent: Dec. 13, 2016

(54) METHOD FOR MAKING HIGH VOLTAGE INTEGRATED CIRCUIT DEVICES IN A FIN-TYPE PROCESS AND RESULTING DEVICES

(71) Applicant: GLOBALFOUNDRIES Inc., Grand Cayman (KY)

(72) Inventor: Jagar Singh, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/965,193

(22) Filed: Dec. 10, 2015

(65) Prior Publication Data

US 2016/0111422 A1 Apr. 21, 2016

Related U.S. Application Data

(62) Division of application No. 14/515,070, filed on Oct. 15, 2014, now Pat. No. 9,276,088.

(51) Int. Cl.
| | |
|---|---|
| *H01L 29/66* | (2006.01) |
| *H01L 27/088* | (2006.01) |
| *H01L 21/762* | (2006.01) |
| *H01L 29/06* | (2006.01) |
| *H01L 29/08* | (2006.01) |
| *H01L 29/165* | (2006.01) |
| *H01L 21/8234* | (2006.01) |

(52) U.S. Cl.
CPC ..... *H01L 27/0886* (2013.01); *H01L 21/76224* (2013.01); *H01L 21/823431* (2013.01); *H01L 21/823481* (2013.01); *H01L 29/0649* (2013.01); *H01L 29/0684* (2013.01); *H01L 29/0847* (2013.01); *H01L 29/165* (2013.01); *H01L 29/66795* (2013.01)

(58) Field of Classification Search
CPC ............... H01L 29/66795; H01L 27/76224; H01L 27/0886; H01L 21/823821; H01L 27/0924; H01L 27/10879
USPC .............. 257/335, 391, 347, 213, 499–502; 438/253
See application file for complete search history.

(56) References Cited

U.S. PATENT DOCUMENTS

| | | |
|---|---|---|
| 8,779,527 B2 | 7/2014 | Merelle et al. |
| 2012/0126885 A1 | 5/2012 | Juengling et al. |

*Primary Examiner* — Sonya D McCall Shepard
(74) *Attorney, Agent, or Firm* — Ditthavong Steiner, P.C.

(57) ABSTRACT

Methods for making high voltage IC devices utilizing a fin-type process and resulting devices are disclosed. Embodiments include forming two pluralities of silicon fins on a substrate layer, separated by a space, wherein adjacent silicon fins are separated by a trench; forming an oxide layer on the substrate layer and filling a portion of each trench; forming two deep isolation trenches into the oxide layer and the substrate layer adjacent to the two pluralities of silicon fins; forming a graded voltage junction by implanting a dopant into the substrate layer below the two pluralities of silicon fins; forming a gate structure on the oxide layer and between the two pluralities of silicon fins; implanting a dopant into and under the two pluralities of silicon fins, forming source and drain regions; and forming an epitaxial layer onto the two pluralities of silicon fins to form merged source and drain fins.

18 Claims, 11 Drawing Sheets

BACKGROUND

BACKGROUND

BACKGROUND

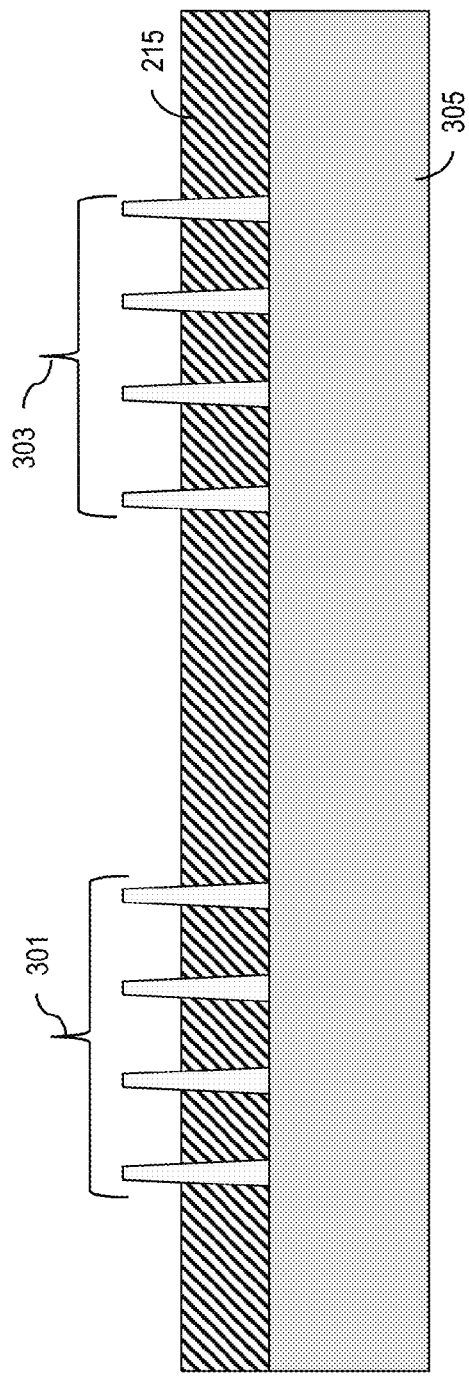
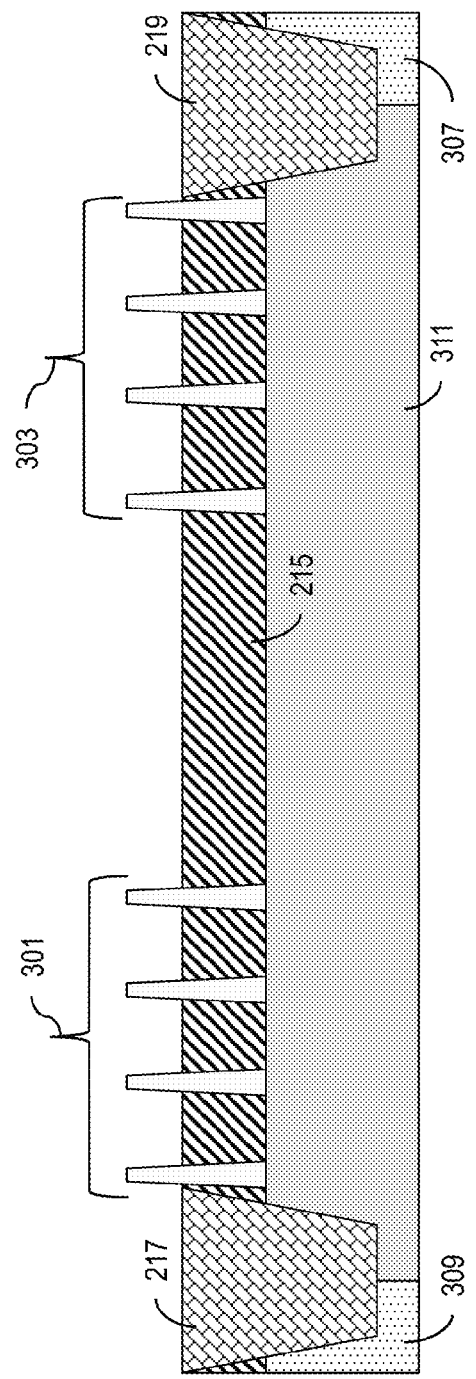
FIG. 3A
FIG. 3B

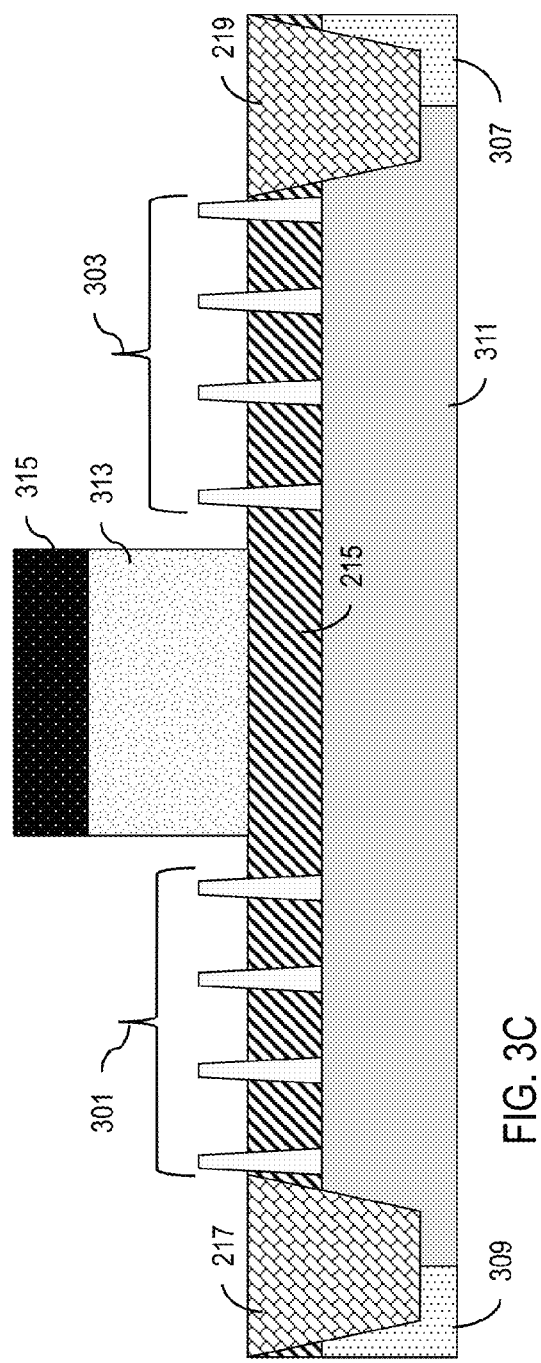
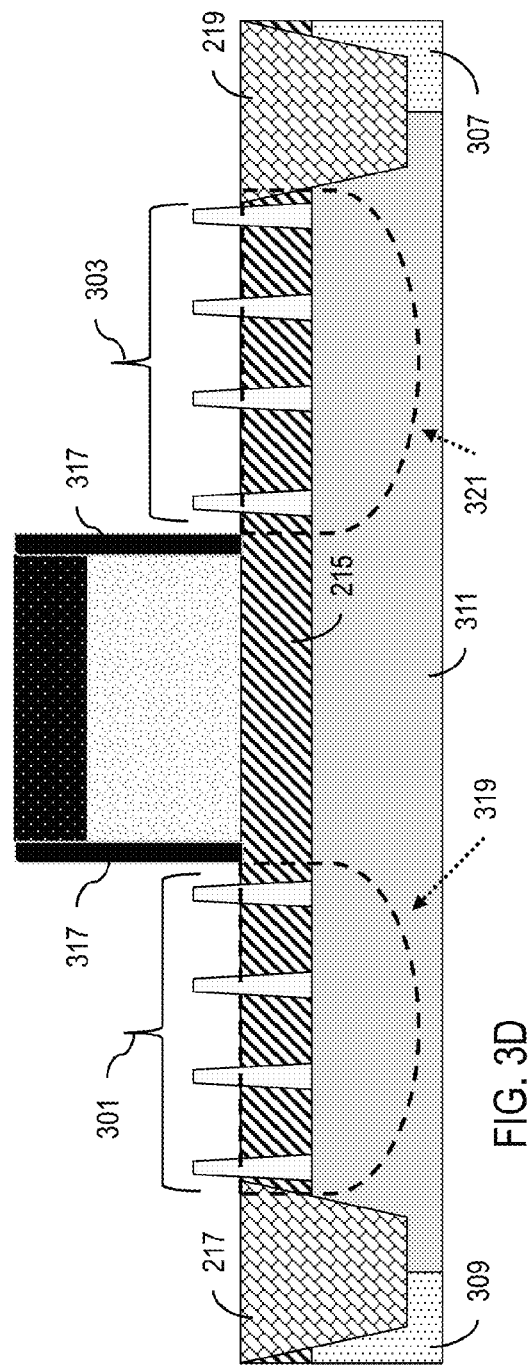
FIG. 3C
FIG. 3D

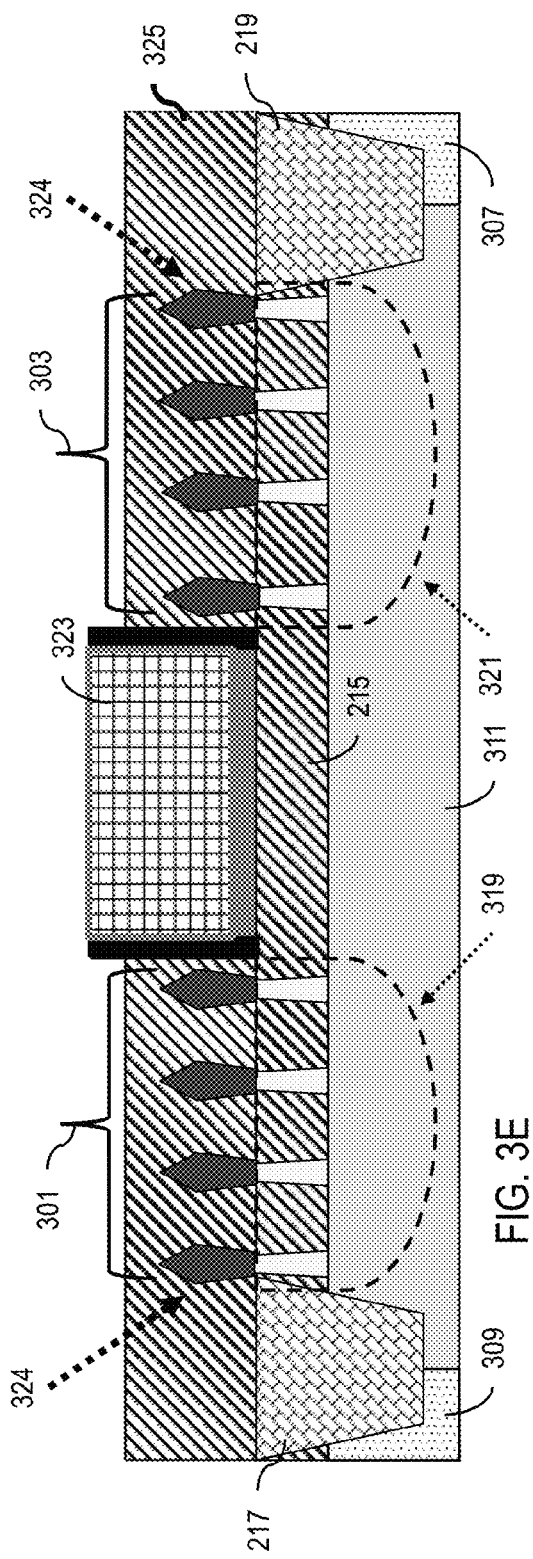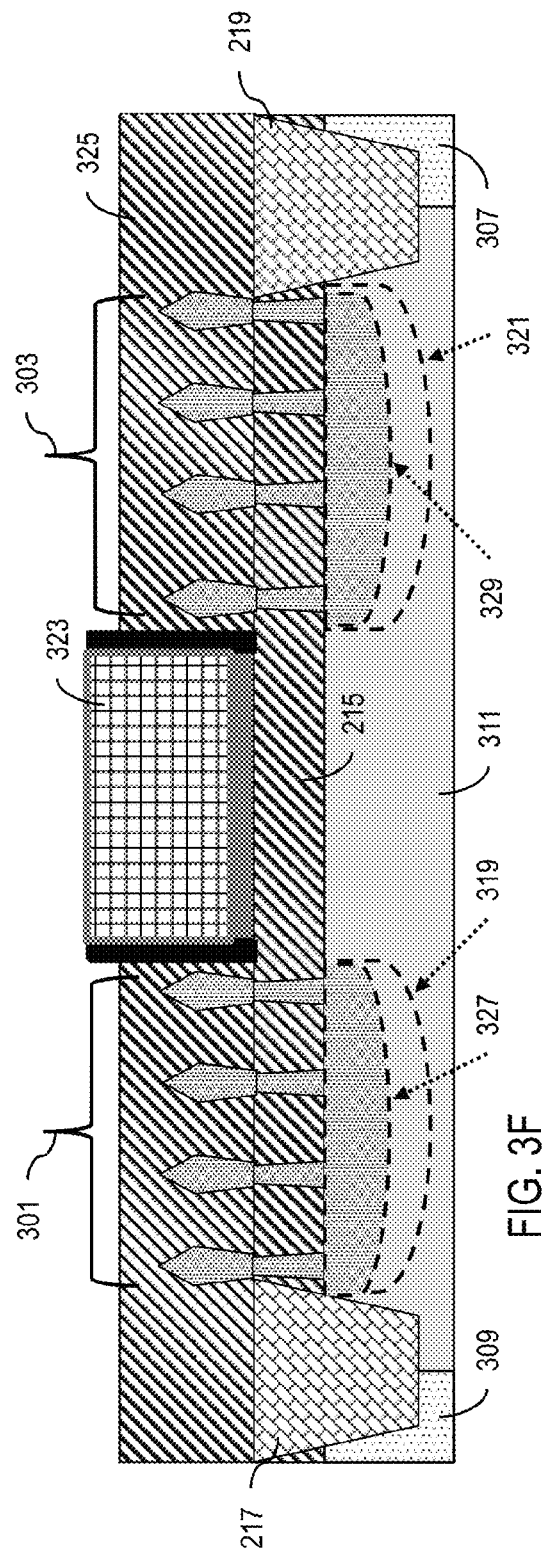
FIG. 3E
FIG. 3F

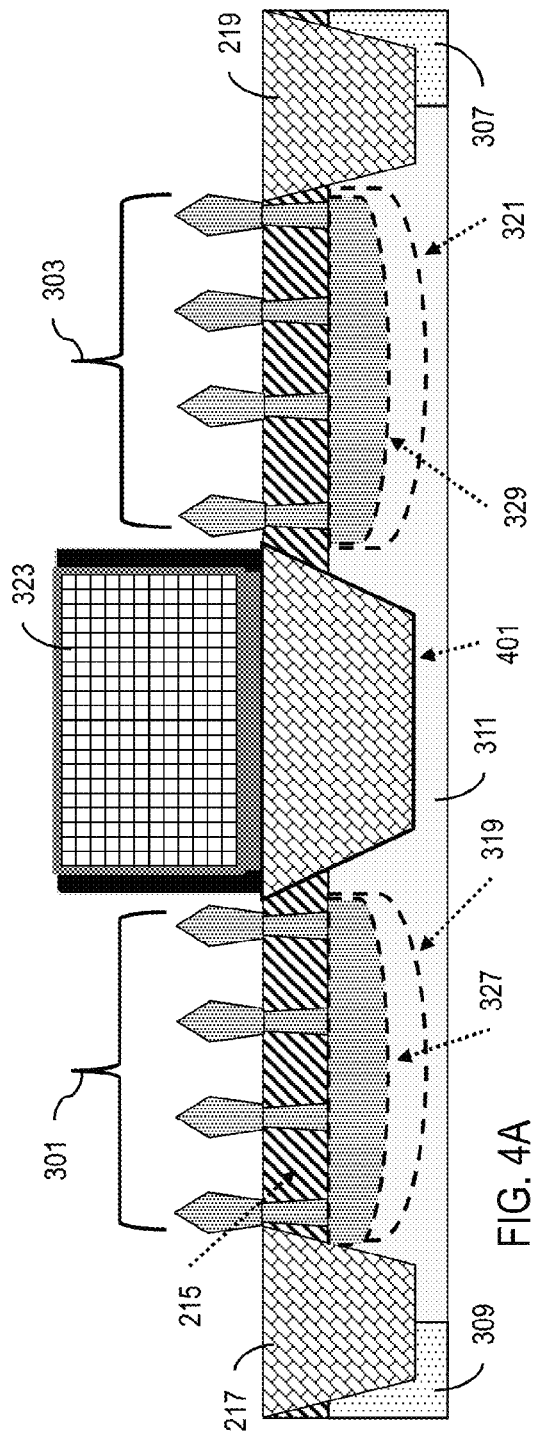
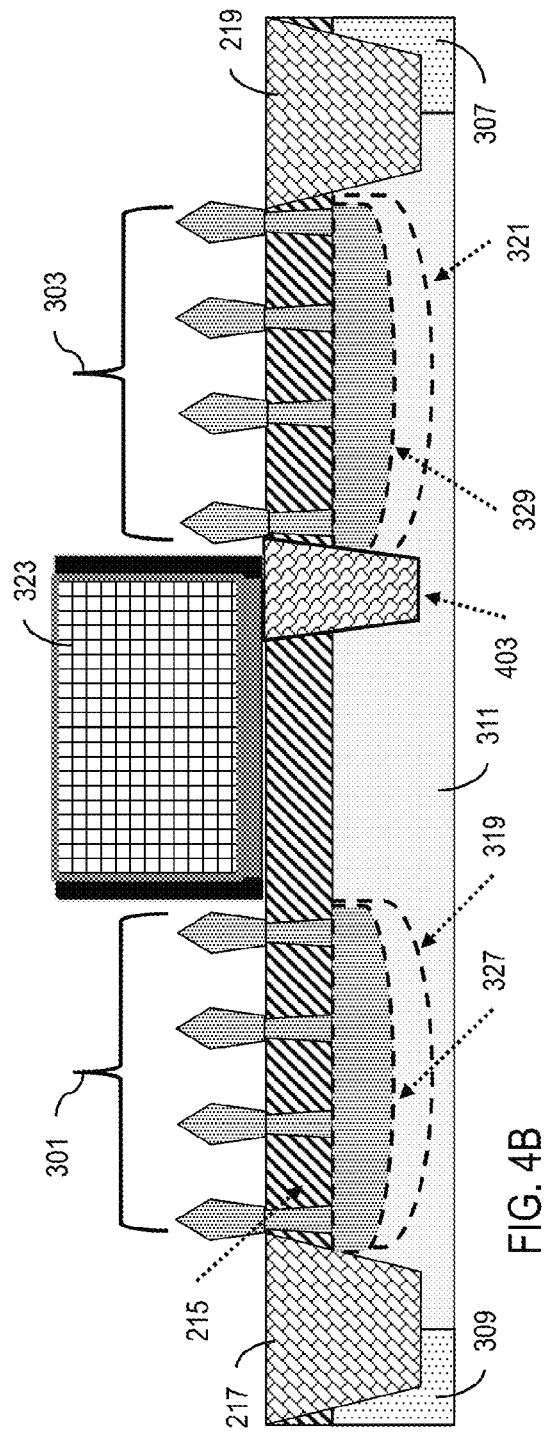
FIG. 4A
FIG. 4B

METHOD FOR MAKING HIGH VOLTAGE INTEGRATED CIRCUIT DEVICES IN A FIN-TYPE PROCESS AND RESULTING DEVICES

CROSS-REFERENCE TO RELATED APPLICATION

This application is a Divisional of U.S. application Ser. No. 14/515,070, filed Oct. 15, 2014, the content of which is incorporated herein by reference in its entirety.

TECHNICAL FIELD

The present disclosure relates generally to designing and fabricating integrated circuit (IC) devices. The present disclosure is particularly applicable to designing and fabricating high voltage IC devices utilizing processes of designing and fabricating fin-type field-effect-transistor (FINFET) IC devices.

BACKGROUND

Generally, an IC device may include high or low voltage devices (e.g., transistors) that can provide different functionalities and have different applications. Also, an IC device can be designed as a system on chip (SoC), which may include a combination of mixed-signal, digital, or analog circuits for implementing radio frequency (RF), memory, logic, high voltage interface, and the like functionalities. IC devices may have applications in automotive, mobile electronics, medical, or other technology areas, wherein various voltage or signal levels may be present. In some applications, digital circuits would require analog or high voltage interface circuits that would be associated with high voltage inputs as well as high gate drive voltages. Usually, high voltage devices, such as high voltage complementary metal-oxide-semiconductor (CMOS) devices, are fabricated via different processes than processes used in the fabrication of lower voltage devices. For example, high voltage devices may require additional processing or masking steps as well as a need to be fabricated at a different scale (e.g., 180 or 130 nanometer (nm)) when compared to more advanced processes to fabricate FINFET type devices at 65, 55, 45 nm or lower scales.

FIGS. 1A and 1B schematically illustrate planar transistor and FINFET structure, respectively, in example IC devices. Adverting to FIG. 1A, a conventional planar metal-oxide-semiconductor field-effect-transistor (MOSFET) is illustrated, which includes a silicon substrate 101, a silicon layer 103, a source region 105, a drain region 107, and a logic gate that includes a poly-silicon layer 109 on a layer of gate oxide 110.

FIG. 1B illustrates an example IC device that includes a FINFET type transistor and a vertical fin 111, which includes a source region 111a and a drain region 111b, and a logic gate (e.g., a trigate) that includes a poly-silicon vertical structure 113 that wraps around a layer of gate oxide 110, which wraps around the top and sidewall surfaces of the fin 111 for controlling a current flow from the source region to the drain region of the fin.

FIG. 1C illustrates a cross-sectional view of the IC device of FIG. 1A along line 1A-1A' where an application of a voltage to the logic gate 109 creates a channel between the source and drain regions that allows for a current 115 to flow from the source region to the drain region. An important parameter of the device can be its breakdown voltage, which is the voltage (e.g., between the source and drain regions) that the device can withstand without damage to its circuitries. Additionally, leakage current between the source and drain regions as well as between adjacent devices can affect efficiency of an IC device. The leakage current may be a function of application of a voltage, where a high voltage at a device may cause high leakage current in a surrounding area in the device. As noted, among considerations in designing and fabricating high voltage transistors are the additional fabrication process steps and the potential leakage currents in an IC device.

A need therefore exists for a methodology for designing and making high voltage IC devices utilizing a fin-type process with protection against potential leakage current and the resulting device.

SUMMARY

An aspect of the present disclosure is a fin-type high voltage IC device with protection against leakage currents in the device.

Another aspect of the present disclosure is a method for designing and fabricating a high voltage fin-type device with low leakage currents in the device.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including forming first and second pluralities of silicon fins on an upper surface of a substrate layer, separated by a space, wherein each pair of adjacent silicon fins is separated by a trench along the upper surface of the substrate layer; forming an oxide layer on the upper surface of the substrate layer and filling in a portion of each trench along the upper surface of the substrate layer; forming first and second deep isolation trenches into the oxide layer and into the substrate layer adjacent to the first and second pluralities of silicon fins; forming a graded voltage junction by implanting one or more concentration levels of a dopant into the substrate layer below each of the first and second pluralities of silicon fins; forming a gate structure on an upper surface of the oxide layer, positioned at the space between the first and second pluralities of silicon fins; implanting a dopant into and under the first and second pluralities of silicon fins, forming source and drain regions, respectively; and forming an epitaxial layer onto the first and second pluralities of silicon fins to form merged source and drain fins, respectively.

Further aspects in forming of the one or more graded voltage junctions include forming a high voltage junction including forming a graded junction and implanting a high concentration level of the dopant into the substrate layer below each of the first and second pluralities of silicon fins in order to form a high voltage source region and a high voltage drain region. Some aspects in forming of the one or more graded voltage junctions further include forming a low voltage junction by implanting a high concentration level of the dopant into a second source region and a second drain region in the substrate layer to form a low voltage source region and a low voltage drain region.

Another aspect includes forming a dummy gate prior to the forming of the graded voltage junction below each of the first and second pluralities of silicon fins; and replacing the dummy gate with a replacement metal gate over a gate oxide layer subsequent to the forming of the graded voltage junction below each of the first and second pluralities of silicon fins.

Some aspects include forming a layer of N-epitaxial or embedded silicon-germanium on exposed surfaces of the first and second pluralities of silicon fins prior to the implanting of the dopant into and under the first and second pluralities of silicon fins. In another aspect, the method includes forming a deep gate isolation trench substantially under the gate structure and in between the one or more source regions and the one or more drain regions. In one aspect, the method includes forming a deep isolation trench adjacent to an inner boundary of the drain region. Further aspects include orienting the first and second pluralities of silicon fins in parallel with the gate structure. In one aspect, the method includes orienting the first and second pluralities of silicon fins perpendicular to the gate structure.

Another aspect of the present disclosure includes a device including: first and second pluralities of silicon fins on an upper surface of a substrate layer, separated by a space, wherein each pair of adjacent silicon fins is separated by a trench along the upper surface of the substrate layer; an oxide layer on the upper surface of the substrate layer filling in a portion of each trench along the upper surface of the substrate layer; first and second deep isolation trenches in the oxide layer and in the substrate layer adjacent to the first and second pluralities of silicon fins; a graded voltage junction comprising one or more concentration levels of a dopant in the substrate layer below each of the first and second pluralities of silicon fins; a gate structure on an upper surface of the oxide layer, positioned at the space between the first and second pluralities of silicon fins; source and drain regions implanted by a dopant in and under the first and second pluralities of silicon fins; and an epitaxial layer on the first and second pluralities of silicon fins forming merged source and drain fins, respectively.

Some aspects of the device include a high voltage junction comprising a graded junction and a high concentration level of the dopant in the substrate layer below each of the first and second pluralities of silicon fins forming a high voltage source region and a high voltage drain region. In one aspect, the device includes a low voltage junction comprising a high concentration level of the dopant in a second source region and a second drain region in the substrate layer forming a low voltage source region and a low voltage drain region. Further aspects of the device include a layer of N-epitaxial or embedded silicon-germanium on exposed surfaces of the first and second pluralities of silicon fins. Further aspects, a deep gate isolation trench substantially under the gate structure and in between the one or more source regions and the one or more drain regions. Other aspects of the device include, a deep isolation trench adjacent to an inner boundary of the drain region. Additional aspects of the device include the first and second pluralities of silicon fins oriented in parallel with the gate structure. Some aspects of the device include the first and second pluralities of silicon fins oriented perpendicular to the gate structure.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 3A through 3H illustrate cross sectional views of an example high voltage IC device including silicon fins, in accordance with an exemplary embodiment;

FIGS. 4A and 4B illustrate cross-sectional views of an example high voltage IC device including silicon fins and isolation trenches, in accordance with an exemplary embodiment;

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of leakage currents, high operating costs, and extra processing/masking steps attendant upon fabricating a high voltage operating IC device with a high gate voltage application. The present disclosure addresses and solves such problems, for instance, by, inter alia, utilizing fin-type IC fabrication processes to fabricate silicon fins in a high voltage IC device and including a plurality of isolation wells to protect against leakage currents in the IC device, where a thick gate oxide can enable operation of the device at a higher gate voltage.

Figure 1B:
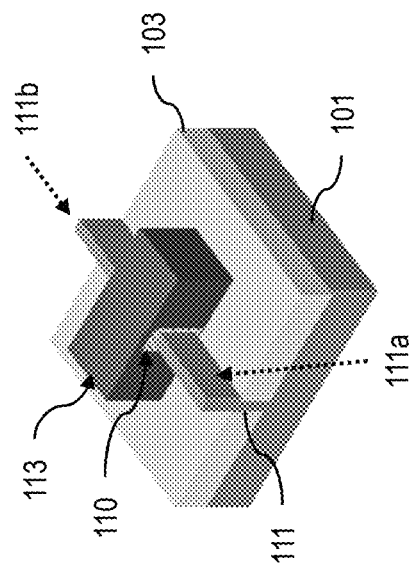
FIGS. 1A and 1B schematically illustrate planar transistor and FINFET structure, respectively, in example IC devices.
Figure 1A:
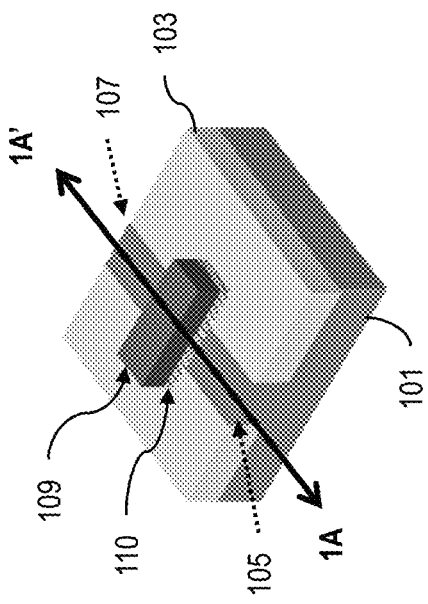
Figure 1C:
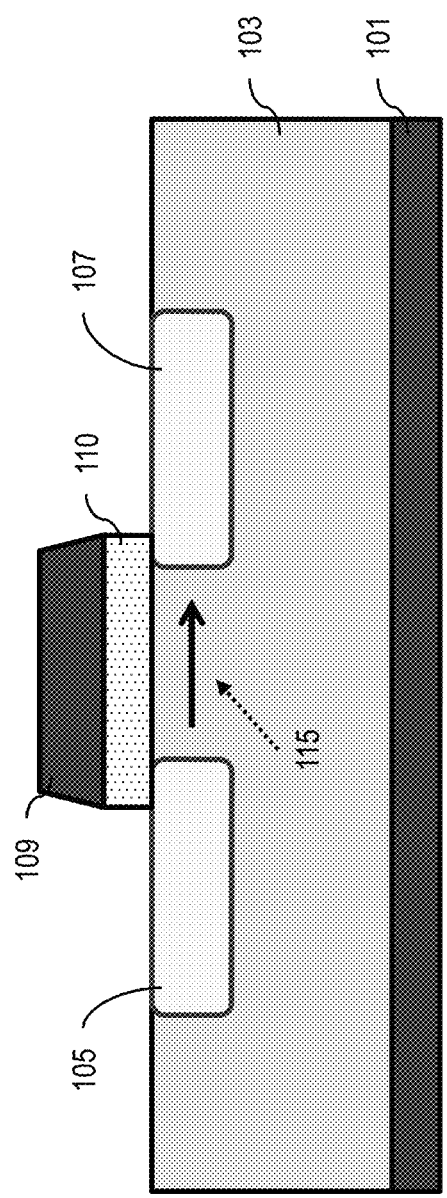
FIG. 1C illustrates a diagram of a cross-sectional view of an example IC device.
Figure 2:
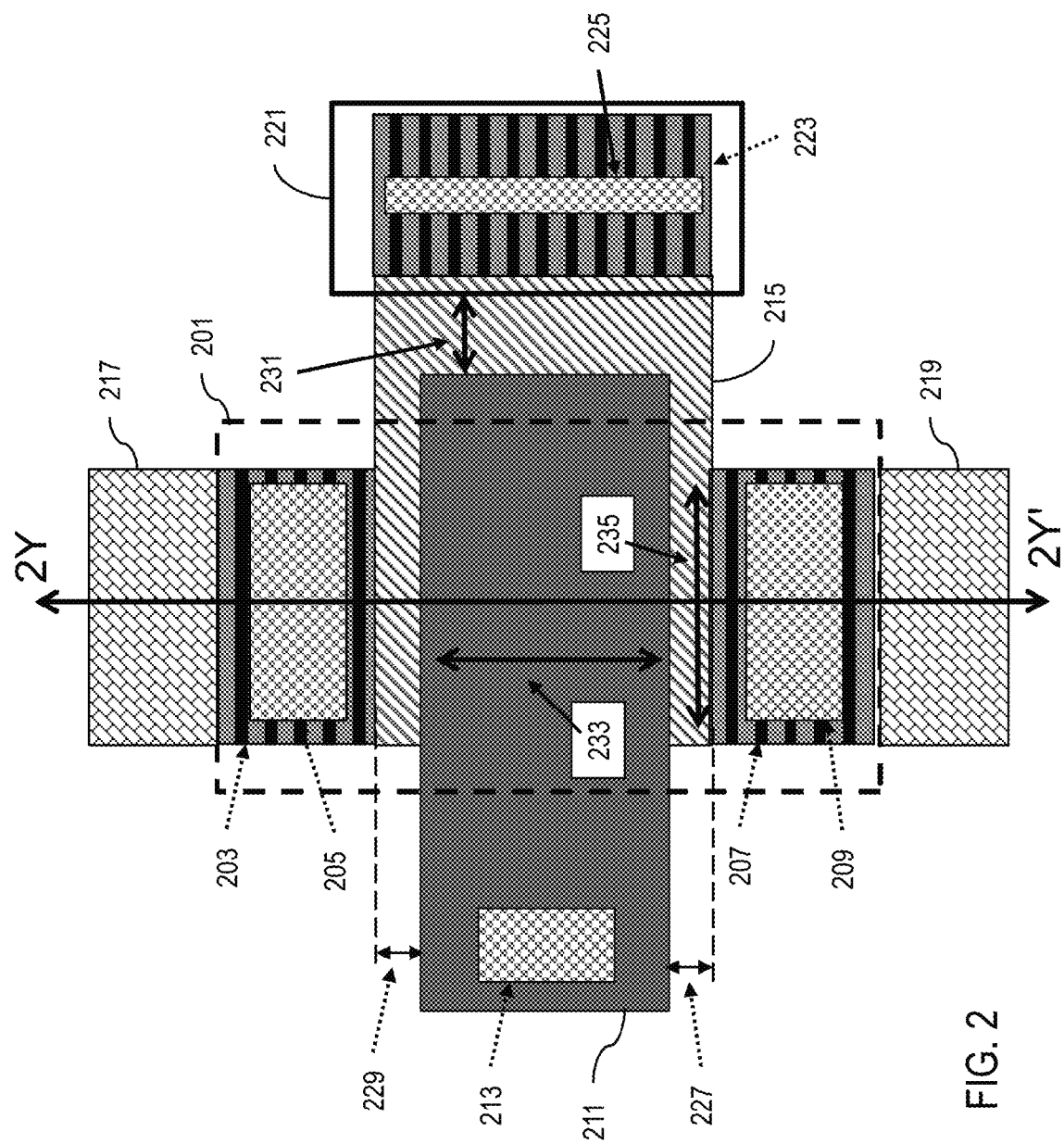
FIG. 2 illustrates a top view of a layout of an example IC device including silicon fins parallel to a logic gate, in accordance with an exemplary embodiment.

FIG. 2 illustrates a top view of a layout of an example IC device including silicon fins parallel to a logic gate. FIG. 2 includes n-well 201 that includes a source active area 203 with a plurality of silicon fins, a contact 205 in connection with the plurality of silicon fins, a drain active area 207 with a plurality of silicon fins, a contact 209 in connection with the plurality of silicon fins, a logic gate 211 and its contact 213 on a shallow trench isolation (STI) layer 215. Additionally, FIG. 2 includes a dual isolation trench 217 adjacent to the source active area 203 and a dual isolation trench 219 adjacent to the drain active area 207. The dual isolation trenches may be formed post formation of shallow trenches by employing a similar process, where a dual isolation trench includes a thicker filling oxide that extends to a deeper depth in the substrate of the IC device. Further, the diagram 200 includes a p-well 221, which includes active area 223 with a plurality of silicon fins, and a contact 225 in connection with the plurality of silicon fins. Spacing parameter 227 indicates gate-to-drain distance ($d_{gd}$) to avoid drain-to-gate breakdown when operating at a high voltage (e.g., 40 Volts (V)). Similarly, a spacing parameter 229 indicates gate-to-source distance ($d_{gs}$) that can be utilized to optimize the on-resistance (Ron) of the device. Moreover, a spacing parameter 231 indicates spacing between back-gate to the p-well ($d_{gb}$), which may be used to optimize electric charge collection to improve the breakdown voltage. Further, a ratio based on length 233 and width 235 parameters of the logic gate 211 may be utilized to control the current flow between the drain and source regions, response time of the transistor, resistance of the transistor, or the like performance characteristics of the device.

Figure 3G:
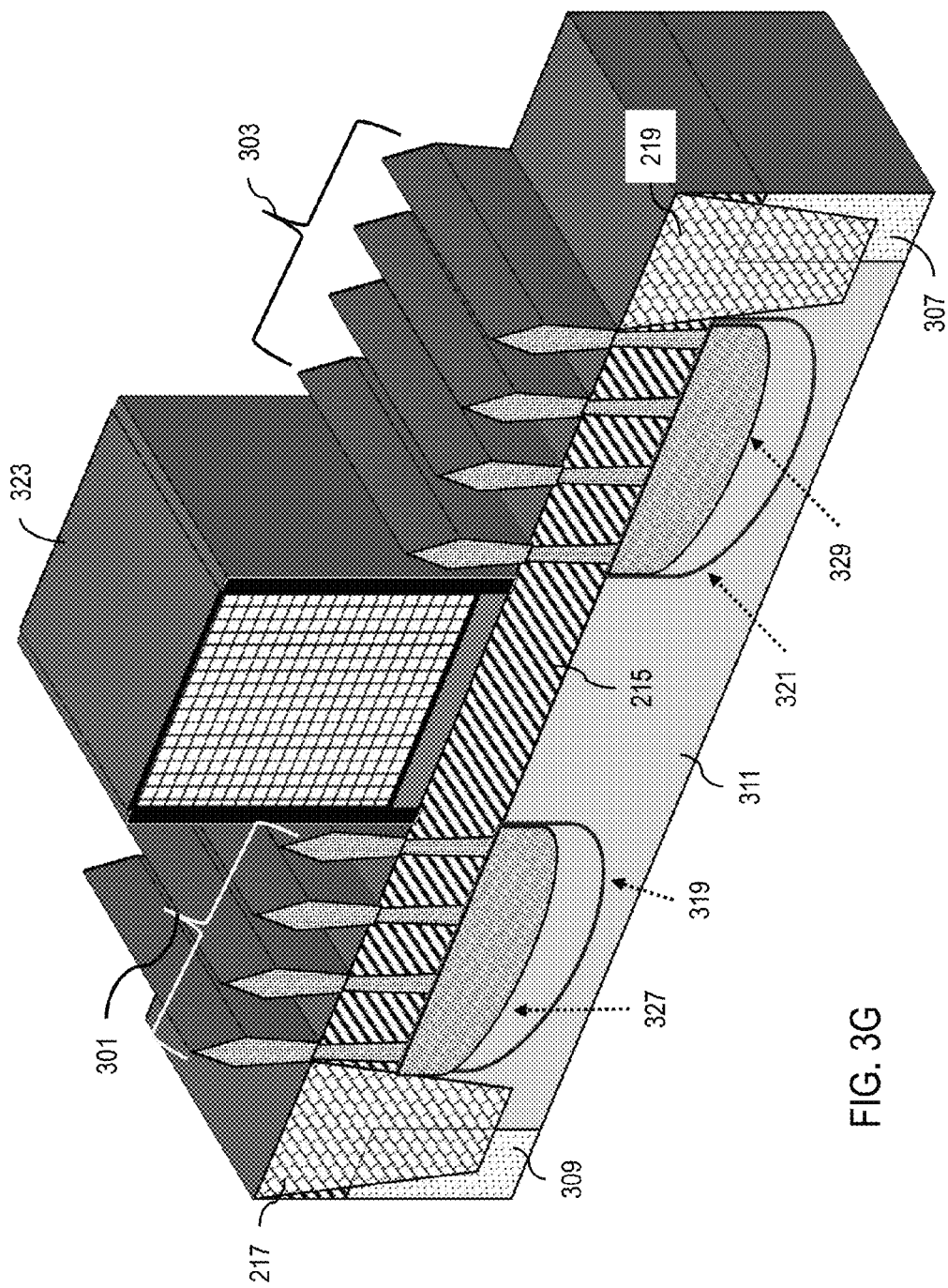

FIGS. 3A through 3H illustrate cross sectional views of a process flow for forming a high voltage IC device including silicon fins, in accordance with an exemplary embodiment. The cross-sectional views include two dimensional (2D) and three dimensional (3D) views along the edge of line 2Y-2Y". FIG. 3A illustrates a first plurality of silicon fins 301 and a second plurality of silicon fins 303 formed on an upper surface of a silicon substrate 305. An oxide layer 215 is deposited on the upper surface and partially fills in a trenches between each pair of adjacent silicon fins 301 or 303. As illustrated in FIG. 3B, regions 307 and 309 are implanted with an n-type dopant to create n-well regions 307 and 309, and a region 311 is implanted with a p-type dopant to create a p-well substrate 311. Additionally, dual isolation trenches 217 and 219 are etched through the oxide layer 215 and into the silicon substrate 305 in areas adjacent to the first plurality of silicon fins 301 and the second plurality of silicon fins 303, wherein junctions of the n-wells 307 and 309 and the p-well 311 substrate are aligned with the dual isolation trenches 217 and 219 to support higher voltage (e.g., greater than 10 V) operations. The dual isolation trenches are filled with an isolation material, such as a single or dual liner silicon nitride (SiN), silicon oxide, and silicon oxide and poly silicon layer combination, where a chemical mechanical polishing (CMP) process may be utilized to planarize the surface. In FIG. 3C, a dummy gate of poly-silicon 313 and SiN cap 315 are formed in the space between the first plurality of silicon fins 301 and the second plurality of silicon fins 303 and on the upper surface of the oxide layer 215. As shown in FIG. 3D, sidewall spacers 317 are formed on opposite sides of the dummy gate adjacent to the first and second pluralities of silicon fins 301 and 303. Additionally, graded junction regions 319 and 321 are implanted with a light dose of a dopant to create a graded (e.g., to support a higher junction breakdown voltage) source junction 319 and a graded drain junction 321.

As illustrated in FIG. 3E, the dummy gate 313 is partially removed and replaced with a metal gate. Specifically, the SiN cap 315 is etched, the poly-silicon 313 is partially etched, and a metal gate is formed on the remaining poly-silicon, forming RMG stack 323. A layer 324 of N-epitaxial (e.g., for NMOS) or embedded silicon-germanium (eSiGe) (e.g., for PMOS) is formed on exposed surfaces of the first plurality of silicon fins 301 (source fins) and the second plurality of silicon fins (drain fins) 303, and then a layer of core field-effect transistor (FET) thin oxide and/or input and output interface FET thick oxide (single gate-thick oxide (Sg/Eg)) 325 is deposited pre-metalization and over the upper surface of the oxide layer 215 covering the first plurality of silicon fins 301 and the second plurality of silicon fins 303. Referring to FIG. 3F, the source fins 301 and the drain fins 303 as well as the corresponding regions 327 and 329, respectively, are implanted with a high (e.g., greater than 1e15 $cm^{-2}$ dose) concentration of dopants to create source and drain junctions 327 and 329 to provide the lower source and drain resistance, wherein extended regions of the junctions graded with lower dopant implants can withstand higher breakdown voltages (e.g., 5 to 200 V).

Figure 3H:
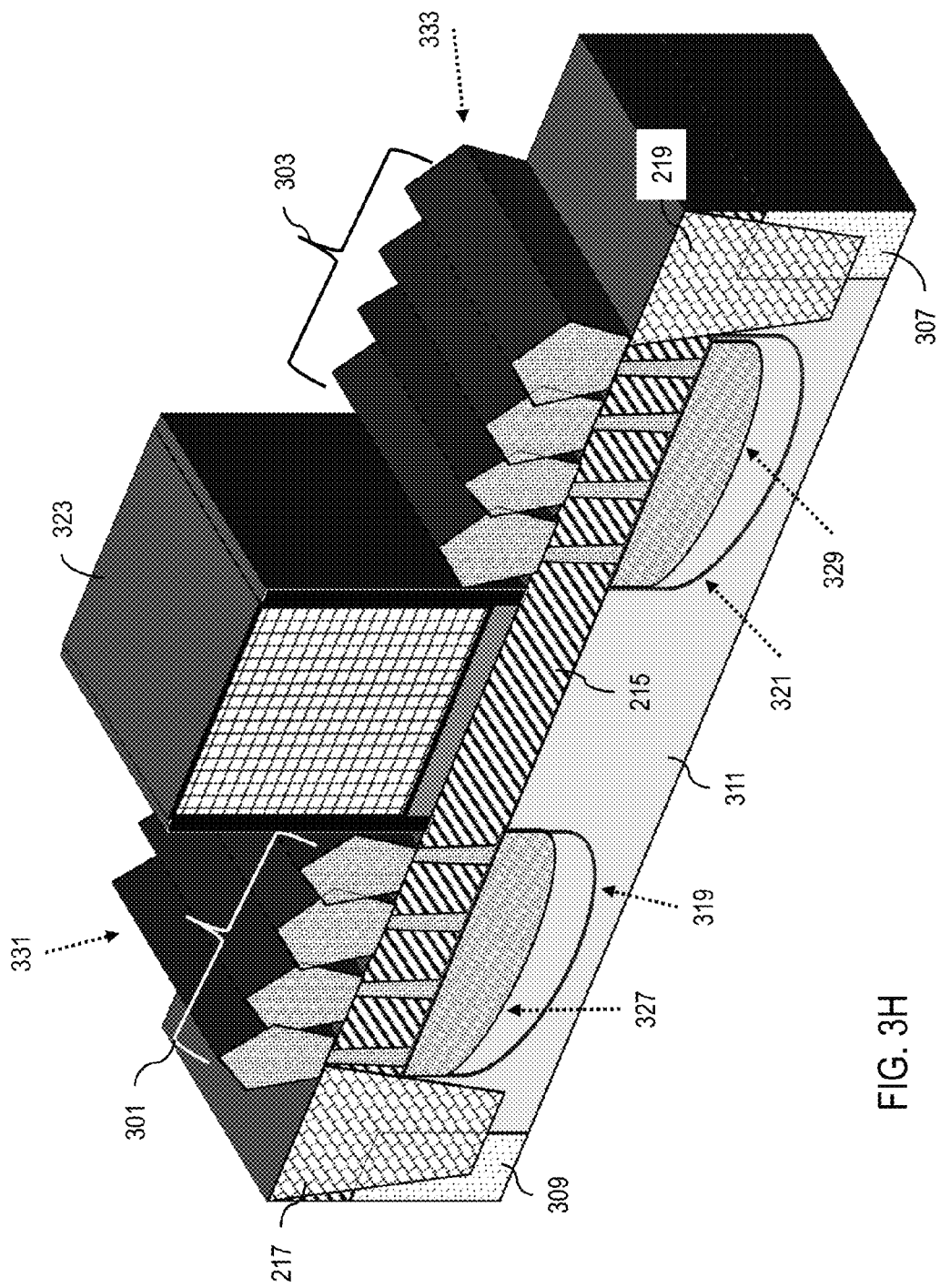

FIG. 3G illustrates a 3D cross-sectional view of the 2D cross-sectional view illustrated in FIG. 3F without oxide layer 325 (for illustrative convenience). Further, FIG. 3H illustrates the 3D view where an epitaxial layer 331 is formed onto the source fins 301, and an epitaxial layer 333 is formed onto the drain fins 303 to form merged source and drain fins, respectively, which, for example, can provide for lower source/drain resistance.

FIGS. 4A and 4B illustrate cross-sectional views of an example high voltage IC device including silicon fins and isolation trenches. FIG. 4A is similar to FIG. 3F, but includes an additional dual isolation trench 401 as a gate oxide that is substantially under the logic gate 323 and embedded into the isolation layer 215 and p-well substrate 311. The isolation trench 401 can provide support for higher gate drive and higher breakdown voltage from the drain region 329 to the source region 327. FIG. 4B includes dual isolation trench 403 as a gate oxide under the logic gate 323 area, but only near the drain region 329, that can support higher breakdown voltage with a lower resistance when the device is on (Ron). The dual isolation trench 403 can enable a smaller channel length device.

The source and drain regions may be formed using N+/NW or similar high doped implants. The source and drain regions may be formed with –P+ (higher dose) or N+ (higher dose) implants to push the junctions into deeper regions on either source or drain side of the substrate 311 to support a high voltage operation at the device. Further, to have a FINFET compatible process in fabrication of high voltage devices, a source or a drain contact can be formed by applying an epitaxial layer over each of the plurality of source 301 and drain 303 fins, respectively.

Figure 5:
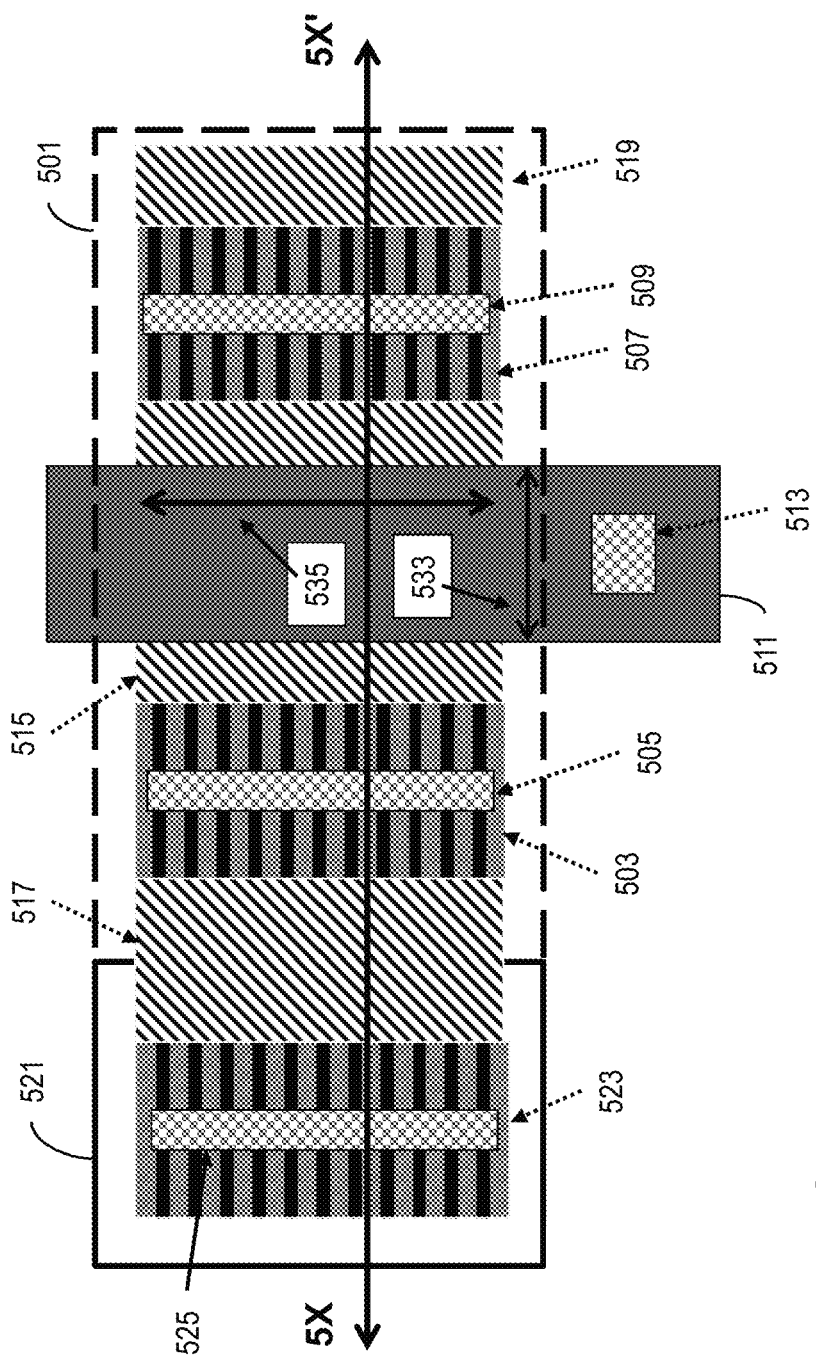
FIG. 5 illustrates a top view of a layout of an example IC device including silicon fins perpendicular to a logic gate, in accordance with an exemplary embodiment.

FIG. 5 illustrates a top view of a layout of an example IC device including silicon fins perpendicular to a logic gate. FIG. 5 includes n-well 501 that includes a source active area 503 with a plurality of silicon fins, a contact 505 in connection with the plurality of silicon fins, a drain active area 507 with a plurality of silicon fins, a contact 509 in connection with the plurality of silicon fins, a logic gate 511 and its contact 513 on a shallow trench isolation (STI) layer 515. The contacts may be of self-aligned type on either side of the gate. Additionally, FIG. 5 includes a dual isolation trench 517 adjacent to the source active area 503 and a dual isolation trench 519 adjacent to the drain active area 507. Further, the FIG. 5 includes a p-well 521, which includes active area 523 with a plurality of silicon fins, and a contact 525 in connection with the plurality of silicon fins. Further, a ratio based on length 533 and width 535 parameters of the logic gate 511 may be utilized to control the current flow between the drain and source regions, response time of the transistor, resistance of the transistor, or the like performance characteristics of the device.

Figure 6:
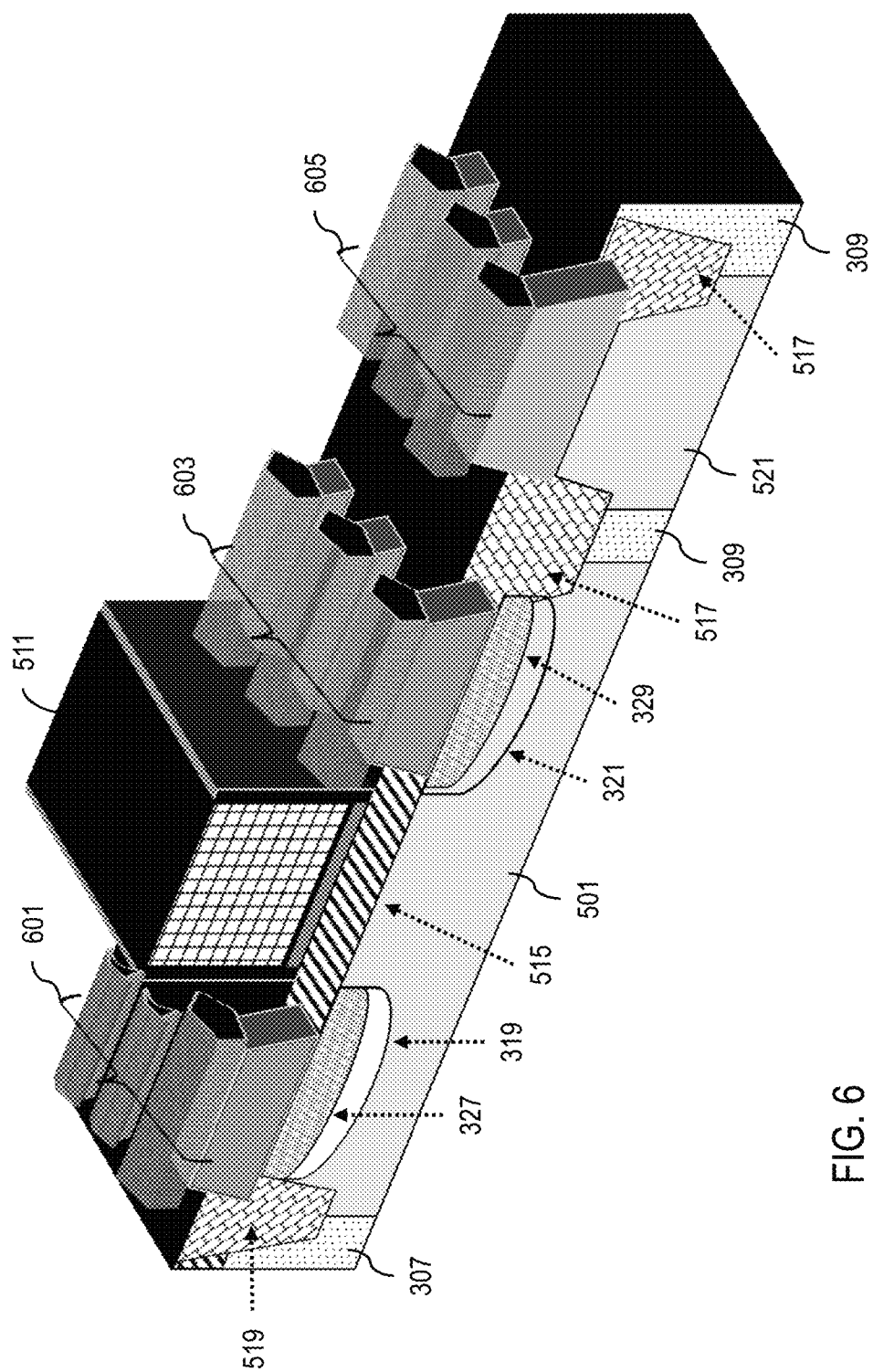
FIG. 6 illustrates a 3D cross sectional views of an example high voltage IC device silicon fins perpendicular to a logic gate, in accordance with an exemplary embodiment.

FIG. 6 illustrates a 3D cross sectional view of an example high voltage IC device with silicon fins perpendicular to a logic gate. The cross-sectional view is along the edge of line 5X-5X' in FIG. 5. FIG. 6 illustrates a 3D cross-sectional view of an example IC device including pluralities of silicon fins 601, 603, and 605 that extend through the upper surface of the oxide layer 515, wherein the fins are in a perpendicular position with reference to the logic gate 511.

The embodiments of the present disclosure can achieve several technical effects, including utilization of FINFET type IC device fabrication processes to fabricate a high voltage IC device. Further, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use SRAM memory cells (e.g., liquid crystal display (LCD) drivers, synchronous random access memories (SRAM), digital processors, etc.)

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   first and second pluralities of silicon fins on an upper surface of a substrate layer, separated by a space, wherein each pair of adjacent silicon fins is separated by a trench along the upper surface of the substrate layer;
   an oxide layer on the upper surface of the substrate layer filling in a portion of each trench along the upper surface of the substrate layer;
   first and second deep isolation trenches in the oxide layer and in the substrate layer adjacent to the first and second pluralities of silicon fins;
   a graded voltage junction comprising one or more concentration levels of a dopant in the substrate layer below each of the first and second pluralities of silicon fins;
   a gate structure on an upper surface of the oxide layer, positioned at the space between the first and second pluralities of silicon fins;
   source and drain regions implanted by a dopant in and under the first and second pluralities of silicon fins; and
   an epitaxial layer on the first and second pluralities of silicon fins forming merged source and drain fins, respectively.

2. The device of claim 1, further comprises:
   a high voltage junction comprising a graded junction and a high concentration level of the dopant in the substrate layer below each of the first and second pluralities of silicon fins forming a high voltage source region and a high voltage drain region.

3. The device of claim 1, further comprises:
   a low voltage junction comprising a high concentration level of the dopant in a second source region and a second drain region in the substrate layer forming a low voltage source region and a low voltage drain region.

4. The device of claim 1, further comprising:
   a layer of N-epitaxial or embedded silicon-germanium on exposed surfaces of the first and second pluralities of silicon fins.

5. The device of claim 1, further comprising:
   a deep gate isolation trench substantially under the gate structure and in between the one or more source regions and the one or more drain regions.

6. The device of claim 1, further comprising:
   a deep isolation trench adjacent to an inner boundary of the drain region.

7. The device of claim 1, further comprising:
   the first and second pluralities of silicon fins oriented in parallel with the gate structure.

8. The device of claim 1, further comprising:
   the first and second pluralities of silicon fins oriented perpendicular to the gate structure.

9. A device comprising:
   first and second pluralities of silicon fins on an upper surface of a substrate layer, separated by a space, wherein each pair of adjacent silicon fins is separated by a trench along the upper surface of the substrate layer;
   an oxide layer on the upper surface of the substrate layer and filling in a portion of each trench along the upper surface of the substrate layer;
   first and second deep isolation trenches in the oxide layer and in the substrate layer adjacent to the first and second pluralities of silicon fins; and
   a graded voltage junction comprising one or more concentration levels of a dopant into the substrate layer below each of the first and second pluralities of silicon fins.

10. The device of claim 9, further comprising: a gate structure on an upper surface of the oxide layer, positioned at the space between the first and second pluralities of silicon fins.

11. The device of claim 10, further comprising:
    one or more first source and first drain regions implanted by a dopant in and under the first and second pluralities of silicon fins; and
    an epitaxial layer on the first and second pluralities of silicon fins forming merged source and drain fins, respectively.

12. The device of claim 9, further comprising:
    a high voltage junction comprising a graded junction and a high concentration level of the dopant in the substrate layer below each of the first and second pluralities of silicon fins forming a high voltage source region and a high voltage drain region.

13. The device of claim 11, further comprising:
    a low voltage junction comprising a high concentration level of the dopant in a second source region and a second drain region in the substrate layer forming a low voltage source region and a low voltage drain region.

14. The device of claim 9, further comprising:
    a layer of N-epitaxial or embedded silicon-germanium on exposed surfaces of the first and second pluralities of silicon fins.

15. The device of claim 11, further comprising:
    a deep gate isolation trench substantially under the gate structure and in between the one or more first source regions and the one or more first drain regions.

16. The device of claim 11, further comprising:
    a deep isolation trench adjacent to an inner boundary of the one or more first drain regions.

17. The device of claim 10, further comprising:
the first and second pluralities of silicon fins oriented in parallel with the gate structure.

18. The device of claim 10, further comprising:
the first and second pluralities of silicon fins oriented perpendicular to the gate structure.

* * * * *